United States Patent
Schneider-Betz et al.

(10) Patent No.: US 8,581,248 B2
(45) Date of Patent: Nov. 12, 2013

(54) THIN FILM TRANSISTOR (TFT) HAVING COPPER ELECTRODES

(75) Inventors: Sabine Schneider-Betz, Dreieich (DE); Martin Schlott, Offenbach (DE)

(73) Assignee: Heraeus Materials Technology GmbH & Co. KG, Hanau (DE)

( * ) Notice: Subject to any disclaimer, the term of this patent is extended or adjusted under 35 U.S.C. 154(b) by 0 days.

(21) Appl. No.: 13/390,388

(22) PCT Filed: Aug. 25, 2010

(86) PCT No.: PCT/EP2010/005191
§ 371 (c)(1),
(2), (4) Date: Feb. 14, 2012

(87) PCT Pub. No.: WO2011/023369
PCT Pub. Date: Mar. 3, 2011

(65) Prior Publication Data
US 2012/0146018 A1    Jun. 14, 2012

(30) Foreign Application Priority Data
Aug. 26, 2009 (DE) .................. 10 2009 038 589

(51) Int. Cl.
*H01L 29/786*    (2006.01)
(52) U.S. Cl.
USPC .................................. 257/43; 257/E29.273
(58) Field of Classification Search
USPC .......................................................... 257/43
See application file for complete search history.

(56) References Cited

U.S. PATENT DOCUMENTS

| | | | |
|---|---|---|---|
| 8,237,163 B2* | 8/2012 | Moon et al. ...................... 257/59 |
| 8,293,595 B2* | 10/2012 | Yamazaki et al. ............. 438/158 |
| 8,319,215 B2* | 11/2012 | Yamazaki et al. ............... 257/43 |
| 8,343,817 B2* | 1/2013 | Miyairi et al. ................ 438/151 |
| 2002/0063287 A1 | 5/2002 | Yamazaki et al. |
| 2006/0275618 A1* | 12/2006 | Kugimiya et al. ............ 428/469 |
| 2007/0034915 A1 | 2/2007 | Hoffman |
| 2007/0134832 A1* | 6/2007 | Oh et al. .......................... 438/30 |
| 2008/0023698 A1* | 1/2008 | Li et al. ............................ 257/43 |
| 2008/0099766 A1 | 5/2008 | Fang et al. |
| 2008/0128689 A1 | 6/2008 | Lee et al. |
| 2009/0189153 A1 | 7/2009 | Iwasaki et al. |
| 2010/0155733 A1* | 6/2010 | Moon et al. ...................... 257/59 |
| 2010/0289020 A1 | 11/2010 | Yano et al. |
| 2011/0006297 A1 | 1/2011 | Inoue et al. |
| 2012/0080678 A1* | 4/2012 | Kim et al. ........................ 257/57 |
| 2012/0126227 A1* | 5/2012 | Maeda et al. .................... 257/43 |

FOREIGN PATENT DOCUMENTS

| | | |
|---|---|---|
| JP | 2009-010089 A | 1/2009 |
| WO | 2009075161 A1 | 6/2009 |
| WO | 2009075281 A1 | 6/2009 |

OTHER PUBLICATIONS

Int'l Search Report issued Dec. 10, 2010 in Int'l Application No. PCT/EP2010/005191: Written Opinion.
Kim et al., "Copper source/drain electrode contact resistance effects in amorphous indium-gallium-zinc-oxide thin film transistors," Physica Status Solidi Rapid Research Letters, vol. 3, Nos. 7-8, pp. 239-241 (2009).
Marquardt et al., "Crystal chemistry and electrical properties of the delafossite structure," Thin Solid Films, vol. 496, pp. 146-156 (2006).
Mine et al., "Control of carrier concentration and surface flattening of $CuGaO_2$ epitaxial films for a p-channel transparent transistor," Thin Solid Films, vol. 516, pp. 5790-5794 (2008).
Office Action issued Aug. 18, 2010 in DE Application No. 10 2009 038 589.4.
Int'l Preliminary Report on Patentability issued Apr. 19, 2012 in Int'l Application No. PCT/EP2010/005191.
Office Action issued Jul. 30, 2013 in KR Application No. 10-2012-7003237.
Office Action issued Aug. 8, 2013 in DE Application No. 10 2009 038 589.4.

* cited by examiner

*Primary Examiner* — Thao P. Le
(74) *Attorney, Agent, or Firm* — Panitch Schwarze Belisario & Nadel LLP

(57) ABSTRACT

A TFT structure is provided in which an oxidic semiconductor is used in combination with an electrode material based on a Cu alloy.

10 Claims, No Drawings

THIN FILM TRANSISTOR (TFT) HAVING COPPER ELECTRODES

CROSS-REFERENCE TO RELATED APPLICATIONS

This application is a Section 371 of International Application No. PCT/EP2010/005191, filed Aug. 25, 2010, which was published in the German language on Mar. 3, 2011, under International Publication No. WO 2011/023369 A1 and the disclosure of which is incorporated herein by reference.

BACKGROUND OF THE INVENTION

The invention relates to a thin-film transistor (TFT), wherein the TFT structure comprises a semiconductor material and electrodes connected to thereto in an electrically conductive manner.

Thin-film transistors are used mainly in flat-screen displays (LCD, OLED, E-paper, etc.). Especially for LCD-TV and OLED applications having a large surface, rapid electric circuits and/or high currents are needed. Copper (Cu) has clear advantages in this respect as compared to the currently most commonly employed Al electrodes and/or Al alloy electrodes.

The a-Si-Technology (amorphous silicon), which is the standard used to date, is difficult to combine with the Cu technology, since the Cu is exposed to temperatures of up to 400° C. during the deposition of the gate oxide and/or in the final CVD step for passivation of the stack of layers, and, for example, source/drain contacts undergo a diffusion reaction with Si in this process. Moreover, copper shows poor adhesion. For this reason, there is an ongoing search for suitable barrier/adhesive layers which, in addition, need to etch well together with the Cu.

Aside from the option to use a barrier layer, attempts are being made to use Cu alloys, in which alloy elements, such as Mg, Mo, W or Mn, are added, which precipitate at the layer boundary during layer growth or a downstream tempering step and thus intrinsically form a barrier and adhesive layer. However, no solutions that are suitable for production purposes have originated from these efforts yet. One main issue is that oxygen is always required for the precipitated element to show good adhesion and barrier function, since the a-Si layer itself has only pure Si at the surface. Attempts to overcome this issue are very laborious, since they require, for example, an initial in-situ oxidation of the surface of the a-Si transistor to be carried out. Moreover, this procedure is associated with the risk of obtaining an insulating boundary layer, which then prevents the desired ohmic contacting with the Cu electrode.

Another problem associated with the a-Si layers is that the current amplification varies and is too low. This is a problem mainly in the case of OLEDs.

BRIEF SUMMARY OF THE INVENTION

It is therefore an object of the present invention to seek a combination of layers for an improved TFT/an improved TFT structure in combination with a Cu-based printed conductor.

The object is achieved by a TFT structure according to the invention comprising a semiconductor material and electrodes, characterized in that the semiconductor material is an oxidic semiconductor material and in that at least one electrode is made of an electrode material based on a Cu alloy. Preferably, at least the source and the drain electrodes are made of the Cu alloy. In particular, at least one alloy element of the Cu-based electrode forms an oxidic intermediate layer at the boundary surface between electrode and oxidic semiconductor material of the TFT structure. The TFT structure can be provided as a structure having the gate disposed on the bottom or on the top. It is advantageous for the oxidic semiconductor material to be made on the basis of at least one oxide selected from the group of indium oxide, zinc oxide, and copper oxide, or on the basis of a mixed oxide based on at least one metal selected from the group of indium, zinc, and copper. An In—Ga—Zn oxide, a Cu—Cr oxide or a Cu—Al oxide can be used in particular.

It is expedient in the TFT structure that at least one alloy element of the Cu alloy have a higher affinity for oxygen than copper. Moreover, it is advantageous if at least one alloy element of the Cu alloy has a higher affinity for oxygen than at least one of the chemical elements of the oxidic semiconductor material of the TFT structure. In particular, the TFT structure according to an embodiment of the invention can be provided such that the Cu alloy contains at least one of the elements: Mg, Mn, Ga, Li, Mo, and W, at a concentration of 0.1-10 at %. It is preferable to use as further electrode material a Cu alloy having a purity of at least 99.9%, wherein the Cu alloy is applied as an intermediate layer over and/or under the pure Cu layer and wherein the intermediate layer is thinner than the Cu layer.

DETAILED DESCRIPTION OF THE INVENTION

Accordingly, the invention is characterized, amongst other features, by a stack of layers which contains an oxidic semiconductor and, for the electrodes, a Cu alloy with an alloy element having a higher affinity for oxygen than copper and preferably having a higher self-diffusion coefficient than copper. The TFT structure is also made on the basis of an oxidic semiconductor, which is contacted to Cu-based electrodes (mainly for source/drain contacts), wherein the electrodes consist of a Cu alloy, the alloy additive in the Cu matrix has a higher affinity for oxygen than copper and has a higher self-diffusion coefficient than copper and wherein the alloy, together with the oxygen of the oxidic transistor, forms a well-adhering conductive intermediate layer, which may also serve a barrier function, if applicable. Oxidic semiconductors, as for example In—Ga—Zn oxide, are an interesting alternative to a-Si, since they grow to be amorphous. As a consequence, they feature very homogeneous etchability, surprisingly good electron mobility, and even current amplification.

The following are conceivable as oxidic semiconductors:
indium (In)-based oxidic semiconductors;
zinc-based oxidic semiconductors;
oxidic semiconductors based on In—Zn oxide containing further oxidic additives;
semiconductors based on In—Ga—Zn oxide; and
semiconductors based on Cu—Cr oxide or Cu—Al oxide.

Conceivable as an electrode material is a Cu alloy having at least one alloy element in a concentration range of 0.1-10 at %, which has a higher affinity for oxygen than the oxygen atoms of the surface of the oxidic semiconductor, such that the alloy element reacts at the surface and thus forms a well-adhering, electrically conductive layer. Specifically, the Cu alloys may be:
Cu:Mo
Cu:W
Cu:Mn
Cu:Mg
Cu:Ga
Cu:Li.

In this context, the oxidic TFT structure can be provided either as transistor with a bottom gate or, just as well as, as a structure with a top gate.

EXEMPLARY EMBODIMENT

First, an electrode made of Cu:Mn 1 at % was deposited by sputtering and configured on a glass substrate. Subsequently, a gate oxide made of $Si_3N_4$ was applied above this layer by CVD. Then, a layer made of In—Ga—Zn oxide was deposited as semiconductor, wherein the metals were selected at an atomic ratio of 50:37:13 at %. Contacting was effected by source/drain electrodes, which were also made of Cu:Mn 1 at %. The stack of layers thus generated was passivated by a $Si_3N_4$ layer by means of CVD. A temperature in the range of 300-450° C. was used in the CVD steps.

The stack of layers thus generated has high electron mobility of at least $10 cm^2/V*s$. The Cu electrodes pass the tape test for adhesion without failures (DIN EN ISO 2409), have good ohmic contacts to the source and drain regions, and have a resistivity of <3.5 µOhm*cm after the temperature treatment.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A TFT structure comprising a semiconductor material and at least one electrode, wherein the semiconductor material is an oxidic semiconductor material, the at least one electrode comprises an electrode material based on a Cu alloy comprising at least one alloying element at a concentration of 0.1 to 10 at %, the at least one alloying element forming an oxidic intermediate layer at a boundary surface between the electrode material and the oxidic semiconductor material, and wherein the TFT structure comprises at least a source electrode and a drain electrode consisting essentially of the Cu alloy.

2. The TFT structure according to claim 1, wherein the structure is provided as bottom-gate or top-gate.

3. The TFT structure according to claim 1, wherein the oxidic semiconductor material comprises at least one oxide selected from indium oxide, zinc oxide, copper oxide, and mixed oxides based on at least one metal selected from indium, zinc, and copper.

4. The TFT structure according to claim 3, wherein the oxidic semiconductor material is selected from an In—Ga—Zn oxide, a Cu—Cr oxide, and a Cu—Al oxide.

5. The TFT structure according to claim 1, wherein at least one alloying element of the Cu alloy has a higher oxygen affinity than copper.

6. The TFT structure according to claim 1, wherein at least one alloying element of the Cu alloy has a higher oxygen affinity than at least one chemical element of the oxidic semiconductor material.

7. The TFT structure according to claim 1, wherein the Cu alloy contains at least one element selected from Mg, Mn, Ga, Li, Mo, and W, at a concentration of 0.1-10 at %.

8. The TFT structure according to claim 5, further comprising a pure Cu layer having a purity of at least 99.9% as a further electrode material, wherein the Cu alloy is applied as an intermediate layer over and/or under the pure Cu layer, and wherein the intermediate layer is thinner than the pure Cu layer.

9. The TFT structure according to claim 6, further comprising a pure Cu layer having a purity of at least 99.9% as a further electrode material, wherein the Cu alloy is applied as an intermediate layer over and/or under the pure Cu layer, and wherein the intermediate layer is thinner than the pure Cu layer.

10. The TFT structure according to claim 7, further comprising a pure Cu layer having a purity of at least 99.9% as a further electrode material, wherein the Cu alloy is applied as an intermediate layer over and/or under the pure Cu layer, and wherein the intermediate layer is thinner than the pure Cu layer.

* * * * *